United States Patent [19]
Schwarz

[11] Patent Number: 5,493,717
[45] Date of Patent: Feb. 20, 1996

[54] ADJACENT CHANNEL INTERFERENCE DETECTION & SUPPRESSION CIRCUIT

[75] Inventor: Detlef Schwarz, Hanover, Germany

[73] Assignee: Blaupunkt-Werke GmbH, Hildesheim, Germany

[21] Appl. No.: 251,713

[22] Filed: May 31, 1994

[30] Foreign Application Priority Data

Jun. 11, 1993 [DE] Germany ............... 43 19 457.5

[51] Int. Cl.⁶ ............... H04B 1/10; H04B 1/06
[52] U.S. Cl. ............ 455/306; 455/307; 455/295; 455/296; 455/266
[58] Field of Search ............ 455/205, 266, 455/339, 340, 303, 306, 285, 307, 295, 296, 302, 254; 333/100, 10.1; 375/101, 102, 103, 348, 349, 350

[56] References Cited

U.S. PATENT DOCUMENTS

| | | | |
|---|---|---|---|
| 3,889,108 | 6/1975 | Cantrell et al. | 235/152 |
| 3,953,802 | 4/1976 | Morris et al. | 325/474 |
| 4,598,426 | 7/1986 | Shiojima | 455/266 |
| 4,907,293 | 3/1990 | Ueno | 455/295 |
| 5,095,534 | 3/1992 | Hiyama | 455/266 |
| 5,220,687 | 6/1993 | Ichikawa et al. | 455/254 |
| 5,303,413 | 4/1994 | Braegas et al. | 455/266 |
| 5,339,455 | 8/1994 | Vogt et al. | 455/266 |

FOREIGN PATENT DOCUMENTS

0561117A1  9/1993  European Pat. Off. .

Primary Examiner—Reinhard J. Eisenzopf
Assistant Examiner—Lee Nguyen
Attorney, Agent, or Firm—Frishauf, Holtz, Goodman, Langer & Chick

[57] ABSTRACT

FM radio receivers, particularly in moving vehicles, are subject to intermittent adjacent-channel interference. It is known to detect such interference and suppress it by narrowing bandwidth in the Intermediate Frequency (IF) signal path. However, it is desirable to again broaden the bandwidth once the interference has subsided. An improved system, which automatically and dynamically adjusts the bandwidth, employs first and second signal level evaluation circuits (11, 12), a comparison stage (13) which compares their outputs, and a variable-bandwidth filter stage (6, 14) controlled by the comparison stage. The comparison stage is programmed with a set of signal difference threshold values and corresponding filter bandwidth values, and controls the filter stage (6, 14) to adjust the bandwidth to the appropriate value, indicated by which signal difference threshold value has been exceeded. In a preferred embodiment, a second IF filter (15) does "double duty" as part of the variable-bandwidth filter stage.

8 Claims, 1 Drawing Sheet

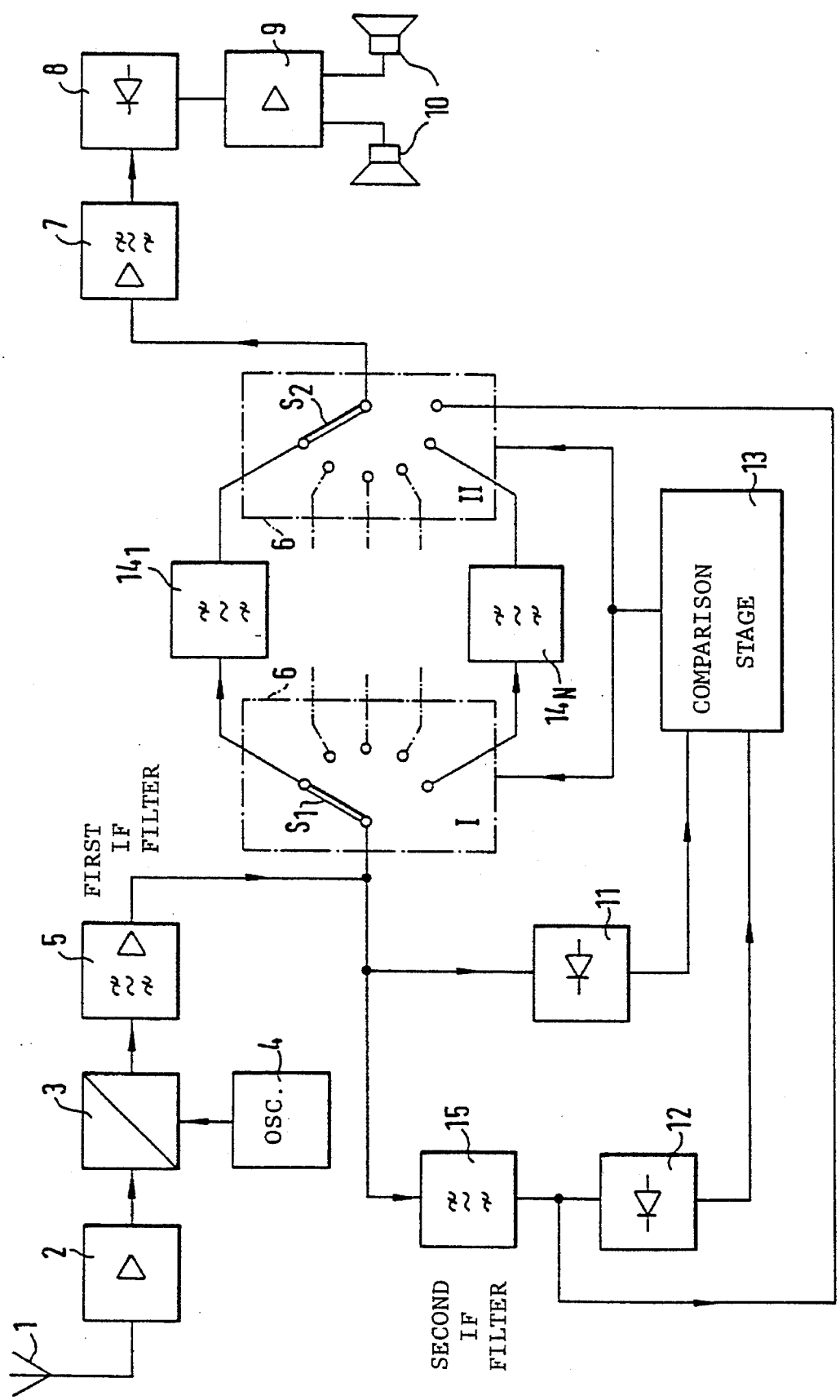

ADJACENT CHANNEL INTERFERENCE DETECTION & SUPPRESSION CIRCUIT

Cross-reference to related U.S. patent and application, the disclosures of which are hereby incorporated by reference:

U.S. Pat. No. 5,303,413, Brägas, AM RADIO RECEIVER WITH SWITCHABLE IF BANDWIDTH, issued 12 Apr. 1994; U.S. Ser. No. 08/021,029, Vogt-Bartels-Arnold-Schwarz, filed 23 Feb. 1993, issued Aug. 16, 1994 as U.S. Pat. No. 5,339,455.

FIELD OF THE INVENTION

The present invention relates generally to a radio receiver circuit for detection and suppression of adjacent-channel interference, and, more particularly, to such a circuit which dynamically adjusts receiver filter bandwidth to the instantaneous amount of the adjacent-channel interference.

BACKGROUND

Such circuits serve for suppression of interference caused when two transmitters broadcast on adjacent frequency channels, and one of the transmitters overmodulates its transmission, so that its signal oversteps the boundaries of its channel. This degrades the reproduction quality of the the signal received from the other, "stepped-on" transmitter. Atmospheric conditions and reflections from moving objects may also contribute to adjacent-channel interference.

It is conventional, especially in AM receivers, to regulate or vary the Intermediate Frequency (IF) bandwidth as a function of the signal strength received from the adjacent channel transmitter. When the adjacent, potentially interfering transmitter is strong, one narrows the bandwidth of the circuit tuned to receive the desired transmitter, in order to avoid picking up any of the interfering adjacent-channel signal. To do this, one provides two receiving circuits, each tuned to one of the two adjacent channels. Each receiving circuit feeds a respective rectifier. The rectifier output voltages are then used in the IF stage of the receiver to adjust the IF bandwidth tuning or filtering. The bandwidth regulation is thus accomplished by damping or coupling or specifying in the IF resonant or tuned circuit.

THE INVENTION

It is an object of the present invention to provide a circuit for an FM radio receiver for detection and suppression of adjacent channel interference, and thus for trouble-free reception of a transmitter subject to adjacent channel interference.

Briefly, the circuit of the present invention includes a array of N different bandpass filters, arranged in parallel, and a control circuit which interposes, in the IF signal path, an appropriate one or more of the filters, depending upon the current magnitude of adjacent-channel interference, as measured by comparing the signal strength at the output of a first IF filter with the signal strength at the output of a second IF filter. A multiple-deck switch selects among filters.

A significant advantage of this structure is that it requires relatively few additional components, yet reliably detects and suppresses adjacent-channel interference and other reception disturbances, such as multi-path reception and ignition noise. It avoids erroneous choices. It does not interfere with reception of traffic bulletins, Radio Data System (RDS) signals, or stereo signals. Unlike conventional circuits for noise sampling, in which the noise detection occurs downstream of the FM demodulator, the present invention does not impair receiver performance or functioning.

Preferably, the signals strengths at the outputs of the first and second IF filters are measured using conventional rectifier/filter combinations. The use of predetermined interference magnitudes to specify particular bandwidth filters provides highly flexible adjustment, to maintain signal strength. The stepwise dynamic adjustment of filter bandwidth substantially avoids discontinuities in the reproduced signal.

A circuit layout, in which the second IF filter is connected into the signal path at one of the positions of the multiple-deck switch, saves an intermediate frequency (IF) filter which would otherwise be needed. Thus, the second IF filter does "double duty."

Preferably, a comparison stage includes a table associating N difference values (between outputs of the first and second level evaluation circuits) with respective filter bandwidth settings. This table can be stored in a PROM (Programmable Read-Only Memory).

DRAWING

The single figure is a schematic block diagram of the interference suppression circuit of the present invention.

DETAILED DESCRIPTION

In the schematically depicted FM receiver, the output signal from an antenna 1 is fed to a high-frequency stage 2, whose output signal in turn is fed to a mixer 3, which is also supplied with the output signal from an oscillator 4. The output signal from mixer 3 is fed to a preamplifying and filtering first IF filter 5. The output of first IF filter 5 is connected to the first wiper or selector $S_1$ of an electronically controlled multiple-deck switch 6 which has two switching decks or pies I and II. Deck I is an input deck of the switch, while deck II is an output deck, and connected between the decks are a plurality of IF filters $14_1$ through $14_N$. The second wiper or selector $S_2$, on deck II of switch 6, is connected to the input of an IF amplifier 7. Downstream of IF amplifier 7 are connected, in series, an FM demodulator 8, an audio frequency amplifier 9, and at least one speaker 10. Although one may also provide a stereo demodulator, a traffic bulletin decoder, and a Radio Data System (RDS) decoder, these are fully described in other patents of the present assignee, and are therefore omitted here, to simplify illustration. See, for example, U.S. Pat. No. 4,862,513. Those skilled in the art can connect such additional elements at the appropriate points in the circuit.

The first selector $S_1$ is connected to the input of a first level evaluation circuit 11 and, via a second IF filter 15, to the input of a second level evaluation circuit 12. Second IF filter 15 has a narrow bandwidth than first IF filter 5. The outputs of level evaluation circuits 11, 12 are connected to respective inputs of a comparison stage 13, which, via its output terminals, synchronously controls selectors $S_1$ and $S_2$ of switch 6, i.e. the selectors move together so that in position 1, they connect respectively to the input and output terminals of filter $14_1$; in position 2, they connect to filter $14_2$, etc. The IF filters $14_1$ through $14_N$ have stepped respective bandwidths, i.e. filter $14_1$ passes the widest bandwidth of all the filters, filter $14_2$ passes a narrower band than does $14_1$, filter $14_3$ passes a narrower band than does $14_2$, and so forth. Filter $14_1$ is dimensioned such that when it is placed in the IF signal path, the bandwidth corresponds to the usual unrestricted bandwidth of an FM transmitter.

A further switching contact of switching deck II of the electronically controlled switch 6 is connected to the output of second IF filter 15. This integrates second IF filter 15 into the variable-bandwidth IF filter system (6, 14$_1$ through 14$_N$). The respective signal levels arising at the input and output of second IF filter 15 are detected by level evaluation circuits 11, 12, typically comprising rectifiers and low-pass filters, and are fed to comparison stage 13.

During reception of a transmitter whose signal is not disturbed by adjacent-channel interference, the signal levels at the input and output of second IF filter 15, although they have differing values, differ from each other by less than a predetermined threshold difference value. Filter 14$_1$ thus remains in the signal path. However, once signals from an adjacent-channel transmitter creep into the IF signal, the signal level at the input of second IF filter 15 strengthens more than the signal level at the output of second IF filter 15. These signal levels are compared with each other in comparison stage 13. If the signal level at the input of second IF filter 15 exceeds the signal level at the output of second IF filter 15 by one of several predetermined threshold difference values, a filter 14$_N$, whose bandwidth corresponds to that predetermined threshold difference value, is inserted into the signal path by switch 6, in place of the previous bandpass filter. In this manner, it becomes possible to pick up, with satisfactory reception quality, a station whose signal would otherwise be garbled by adjacent-channel interference. This is particularly advantageous for a vehicle radio, which is subject to widely fluctuating reception conditions, due to passing buildings, hills and other terrain features, changing antenna alignment as the vehicle turns, and the like.

Various changes and modifications are possible within the scope of the inventive concept. For example, although the variable-bandwidth filter has been illustrated as an arrangement of parallel filters 14$_1$ through 14$_N$, one could also implement it as a series of filters, with switches provided to selectively shunt around particular filters, depending upon the overall filter parameters desired.

Suitable signal level evaluation circuits 11, 12 are model no. TDA1596 made or sold by the firm Philips.

Suitable comparison stages 13 are model nos. LM2902 or TCA 965 available from National Semiconductor and Siemens, respectively.

A preferred range of IF filter bandwidths is from 120 kHz for the broadest filter 14$_1$ to 50 kHz for the narrowest filter.

What is claimed is:

1. A circuit for detection and suppression of adjacent-channel interference in a Frequency Modulation (FM) receiver, which upon occurrence of interfering adjacent-channel signals narrows an Intermediate Frequency (IF) signal path (5, 6, 7) in said receiver, comprising a first Intermediate Frequency (IF) filter (5);

a second Intermediate Frequency (IF) filter (15), having an input connected to an output of said first IF filter, and having a narrower bandwidth than said first IF filter;

a first signal level evaluation circuit (11) connected to said output of said first IF filter (5);

a second signal level evaluation circuit (12) connected to an output of said second IF filter (15);

a comparison stage (13) having two inputs, each connected to a respective output of one of said signal level evaluation circuits (11, 12), and a control output; and a variable-bandwidth band-pass filter stage (6, 14$_1$–14$_N$), having a signal input connected to the output of said first IF filter (5) and a control input connected to said control output of said comparison stage (13), which said comparison stage responds to occurrence of interfering adjacent-channel signals by automatically dynamically adjusting a bandwidth of said band-pass filter stage to a value as large as currently permitted by said interfering adjacent-channel signals.

2. A circuit according to claim 1, wherein each of said signal level evaluation circuits (11, 12) comprises a rectifier stage, and a low-pass filter connected to an output of said rectifier stage.

3. A circuit according to claim 1, wherein said comparison stage (13) stores a plurality of threshold difference values and corresponding filter bandwidth values and, if a value output by said first evaluation circuit exceeds a value output by said second evaluation circuit by more than a particular one of said stored threshold difference values, said comparison stage (13) adjusts said bandwidth of said variable-bandwidth bands-pass filter stage (6) to the filter bandwidth corresponding to said particular threshold difference value.

4. A circuit according to claim 1, wherein said variable-bandwidth band-pass filter stage (6) comprises at least two band-pass filters (14$_1$–14$_N$) having different respective bandwidths, and means for selectively inserting, in said IF signal path, a selected one of said at least two band-pass filters.

5. A circuit according to claim 4, wherein said means for selectively inserting is a switch having a plurality of switch positions and, in one of said positions, said second IF filter (15) is connected in said IF signal path.

6. A circuit according to claim 5, wherein said switch is a multiple-deck switch having first and second decks (I, II).

7. A circuit according to claim 1, wherein said comparison stage (13) is a logic circuit.

8. A circuit according to claim 7, wherein said means for selectively inserting is a switch having a plurality of switch positions and, in one of said positions, said second IF filter (15) is connected in said IF signal path.

* * * * *